United States Patent
Esposito

(10) Patent No.: US 7,570,120 B1
(45) Date of Patent: Aug. 4, 2009

(54) MULTICHANNEL MEMORY-BASED NUMERICALLY CONTROLLED OSCILLATORS

(75) Inventor: Benjamin Esposito, Oviedo, FL (US)

(73) Assignee: Altera Corporation, San Jose, CA (US)

( * ) Notice: Subject to any disclaimer, the term of this patent is extended or adjusted under 35 U.S.C. 154(b) by 119 days.

(21) Appl. No.: 11/820,268

(22) Filed: Jun. 18, 2007

(51) Int. Cl.
*H03L 7/085* (2006.01)
*H03K 19/177* (2006.01)

(52) U.S. Cl. .......................... 331/1 A; 327/106; 326/40
(58) Field of Classification Search ................. 331/1 A; 327/106; 326/40, 38, 46
See application file for complete search history.

(56) References Cited

U.S. PATENT DOCUMENTS

| | | | |
|---|---|---|---|
| 4,855,946 A | 8/1989 | Ruben et al. | |
| 5,517,535 A | 5/1996 | Kroeger et al. | |
| 5,673,212 A * | 9/1997 | Hansen ........................ | 708/271 |
| 6,320,431 B1 | 11/2001 | Potson et al. | |
| 7,095,349 B1 | 8/2006 | Mauer | |
| 7,109,808 B1 | 9/2006 | Pelt | |
| 2008/0074311 A1 * | 3/2008 | Atherton ..................... | 342/202 |

* cited by examiner

*Primary Examiner*—Daniel D Chang
(74) *Attorney, Agent, or Firm*—Treyz Law Group; G. Victor Treyz; David C. Kellogg

(57) ABSTRACT

A multichannel numerically controlled oscillator is provided. The multichannel numerically controlled oscillator has a dual port memory. An output function generation lookup table in the dual port memory is used to generate output functions for the numerically controlled oscillator. A first channel of output is generated based on a first address signal that is presented on a first port of the dual port memory. A second channel of output is generated based on a second address signal that is presented on a second port of the dual port memory. First and second phase accumulators may be used to produce the address signals for the first and second ports of the dual port memory, respectively. The phase accumulators may each contain a register, an adder, and a feedback path. The registers in the phase accumulators and the dual port memory may handle signals at the clock rate of the output channels.

20 Claims, 7 Drawing Sheets

|    | N1 | N2 | N3 | N4 |
|----|----|----|----|----|
| t1 | A  | A  | X  | X  |
| t2 | B  | B  | A  | X  |
| t3 | A  | A  | B  | A  |
| t4 | B  | B  | A  | B  |
| t5 | A  | A  | B  | A  |

FIG. 7

MULTICHANNEL MEMORY-BASED NUMERICALLY CONTROLLED OSCILLATORS

BACKGROUND

This invention relates to numerically controlled oscillators, and more particularly, to multichannel memory-based numerically controlled oscillators for integrated circuits such as programmable logic devices.

Programmable logic devices are a type of integrated circuit that can be programmed by a user to implement a desired custom logic function. In a typical scenario, a logic designer uses computer-aided design (CAD) tools to design a custom logic circuit. These tools help the designer to implement the custom logic circuit using the resources available on a given programmable logic device. When the design process is complete, the CAD tools generate configuration data files. The configuration data is loaded into programmable logic devices to configure them to perform the desired custom logic function.

Programmable logic devices and other integrated circuits often contain numerically controlled oscillators. Numerically controlled oscillators are used to digitally synthesize functions such as sine and cosine functions. An advantage of numerically controlled oscillators over other types of digital oscillators is that they can be adjusted over a wide range of frequencies.

One type of numerically controlled oscillator uses a memory-based architecture. With this type of architecture, a desired output function is represented using values in a look-up table. A phase accumulator is used to produce a continuously incrementing memory address signal that is applied to the look-up table. The output of the look-up table is a digital representation of the desired output function. This digital output function may be converted to an analog signal for use in applications such as radio communications applications. A phase incrementer signal is applied to the input of the phase accumulator to adjust the frequency of the output function.

Multichannel numerically controlled oscillators may be used to produce output functions with different frequencies. For example, a two channel numerically controlled oscillator may be used to produce a sine function output at two different frequencies.

With one multichannel architecture, a time sharing approach is used to share a single phase accumulator and look-up table memory between each of the channels. Although this type of architecture uses memory resources efficiently, it requires the use of a faster clock rate for the phase accumulator and look-up table memory than would otherwise be required. In many situations this type of architecture may not be used, because the clock rate that would be required for the phase accumulator and memory exceeds the capabilities of these components.

It would therefore be desirable to be able to provide a multichannel numerically controlled oscillator that is capable of producing output signals at high frequencies while using memory resources efficiently.

SUMMARY

In accordance with the present invention, multichannel numerically controlled oscillators are provided. A multichannel numerically controlled oscillator may have multiple output channels. Each output channel may be used to supply one or more output functions. The output functions for the numerically controlled oscillator may be generated using an output function generation look-up table stored in a dual port memory. The look-up table may include entries that define each output as a function of input memory address values.

The dual port memory has a first port and a second port. The lookup table in the dual port memory may be independently addressed using the first and second ports. A first channel of output is generated based on a first address signal that is presented on the first port of the dual port memory. A second channel of output is generated based on a second address signal that is presented on the second port of the dual port memory. First and second phase accumulators may be used to produce the address signals for the first and second ports of the dual port memory.

The phase accumulators may each contain a single register, an adder, and a feedback path. The registers in the phase accumulators and the dual port memory may handle signals at the same clock rate as the output channels.

Further features of the invention, its nature and various advantages will be more apparent from the accompanying drawings and the following detailed description of the preferred embodiments.

BRIEF DESCRIPTION OF THE DRAWINGS

FIG. 7 is a table showing how signals may propagate through a two-channel numerically controlled oscillator using a doubled clock rate.

DETAILED DESCRIPTION

The present invention relates to multichannel numerically controlled oscillators. The multichannel numerically controlled oscillators may be formed using dual port memory. The use of dual port memory helps to reduce the amount of memory that is needed to implement the numerically controlled oscillators without requiring the use of elevated clock rates to support multichannel operation.

A multichannel numerically controlled oscillator in accordance with an embodiment of the invention may be implemented on an integrated circuit. For example, the multichannel numerically controlled oscillator may be used in an application specific integrated circuit (ASIC). The multichannel numerically controlled oscillator may also be used in a programmable logic device integrated circuit or other integrated circuits such as digital signal processors. The present invention will generally be described in the context of programmable logic device integrated circuits as an example.

Figure 1:
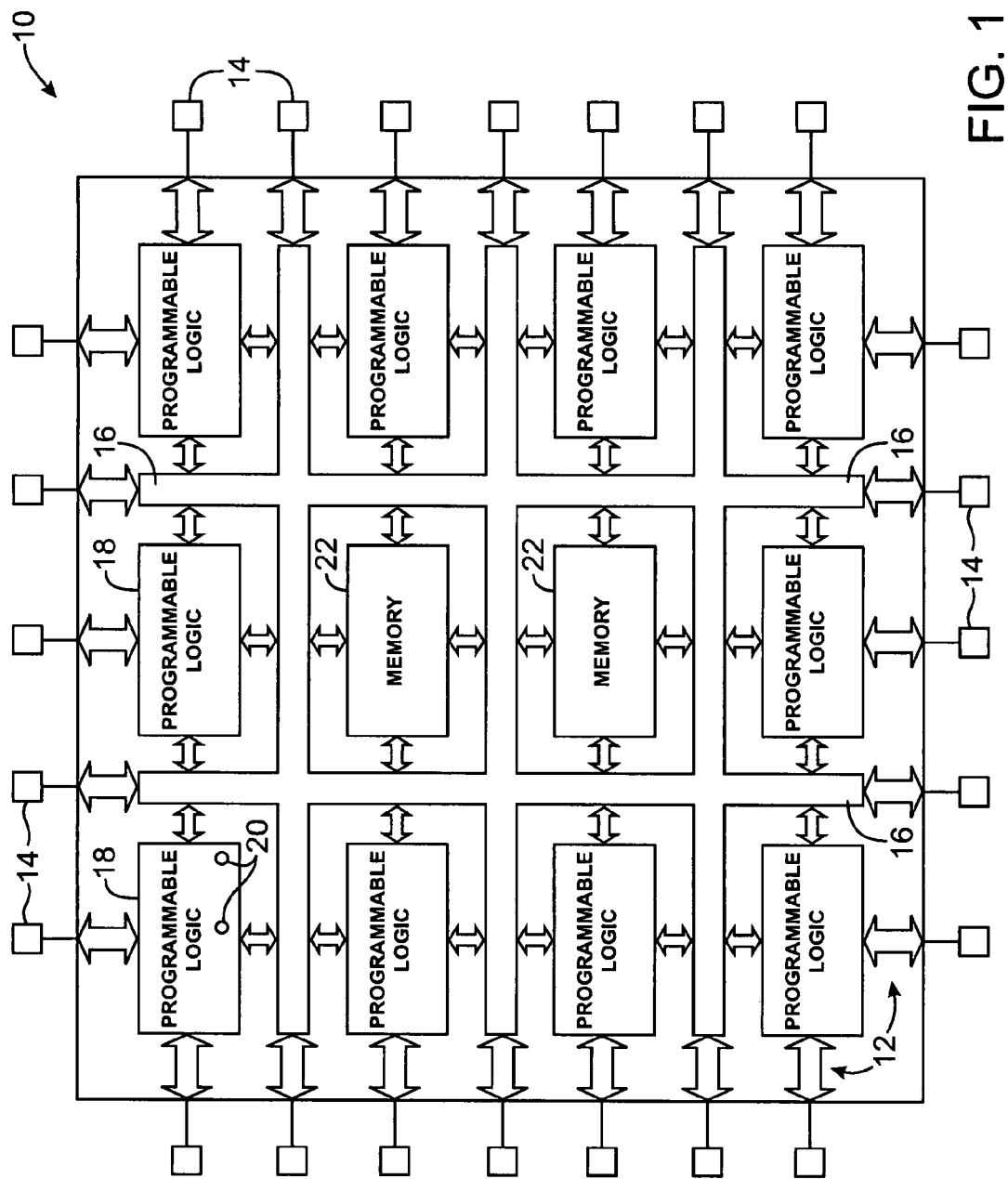
FIG. 1 is a diagram of an illustrative programmable logic device integrated circuit in accordance with an embodiment of the present invention.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include conductive lines and programmable connections between respective conductive lines and are therefore sometimes referred to as programmable interconnects 16.

Programmable logic device 10 contains programmable logic 18 and memory arrays 22.

Programmable logic 18 may include combinational and sequential logic circuitry. The programmable logic 18 may be configured to perform a custom logic function. The programmable interconnects 16 may be considered to be a type of programmable logic 18.

Programmable logic device 10 contains programmable memory elements 20. Memory elements 20 can be loaded with configuration data (also called programming data) using pins 14 and input/output circuitry 12. Once loaded, the memory elements each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory.

Memory arrays 22 contain volatile memory elements such as random-access-memory (RAM) cells. The memory arrays 22 are used to store data signals during normal operation of device 10. The memory arrays 22 need not all be the same size. For example, small, medium, and large blocks of memory 22 may be included on the same programmable logic device. There may, for example, be hundreds of small memory arrays each having a capacity of about 512 bits, two to nine large memory arrays each having a capacity of about half of a megabit, and an intermediate number of medium size memory arrays each having a capacity of about 4 kilobits to 8 kilobits. In general, there may be any suitable size and number of memory arrays 22 on device 10. There may also be any suitable number of regions of programmable logic 18. These are merely illustrative memory block sizes and quantities. If desired, blocks of memory can be combined by configuring programmable logic device 10 by loading configuration data into memory elements 20.

During normal use in a system, memory elements 20 are generally loaded with configuration data from a configuration device integrated circuit via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass transistors, parts of multiplexers (e.g., multiplexers used for forming routing paths in programmable interconnects 16), look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Memory 22 preferably includes at least some dual port memory. A dual port memory array 22 has two independent ports for writing and reading data. In a typical scenario, user logic that is implemented from a portion of programmable logic 18 generates data. The data is stored in a dual port memory array 22. Data is stored by writing the data into memory cells at a particular address within the memory array. The stored data can be accessed by performing a read operation. Because the memory array has two ports, one port may be used to perform read or write operations at the same time that the other port is being used to perform read or write operations. Separate clocks may be used for each port or a common clock may be used.

Figure 2:
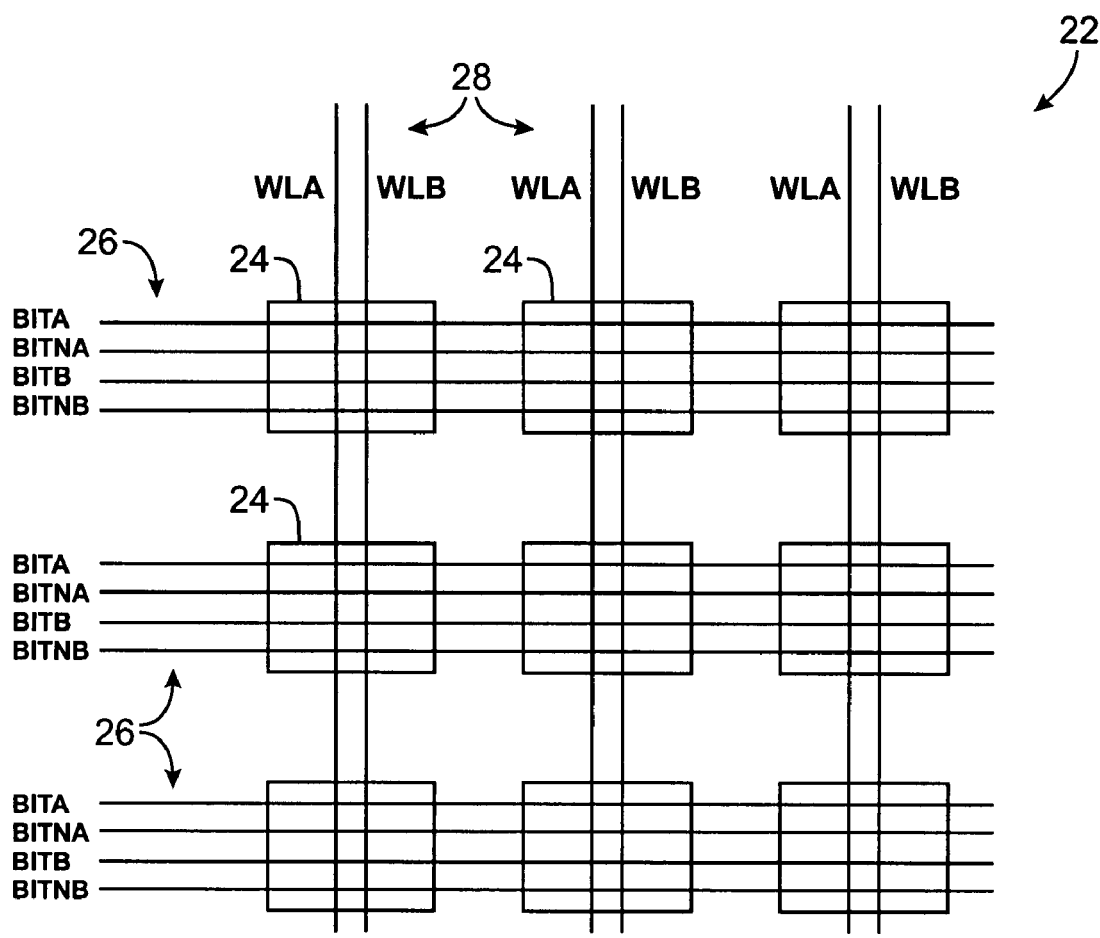
FIG. 2 is a diagram of an illustrative dual port memory array in accordance with the present invention.

An illustrative dual port memory array 22 is shown in FIG. 2. Array 22 has a number of memory cells 24 in which data can be stored and from which data can be retrieved. The illustrative memory array 22 of FIG. 2 has three rows and three columns of memory cells. In an actual integrated circuit, memory array 22 is typically larger. For example, an 8K memory array may have 256 columns and 32 rows of memory cells 24.

Array 22 has bit lines 26 and word lines 28. Bit lines 26 and word lines 28 are used to select which cells 24 are accessed. For example, if a particular word line 28 is asserted during a read operation, the data stored in the cells 24 that are connected to that word line will pass their stored data onto the bit lines 26. During a write operation, data that is to be written into array 22 is placed on bit lines 26 while an appropriate word line 28 is asserted.

Because the array 22 has two ports, there are two word lines 28 associated with each column of memory cells 24. The first word line in each column of cells 24 in FIG. 2 is labeled WLA to indicate that it is associated with a first port ("port A"). The second word line in each column of cells 24 in FIG. 2 is labeled WLB to indicate that it is associated with a second port ("port B"). Control circuitry asserts the word lines in each column individually.

Memory array 22 may use a differential bit line arrangement or a single bit line arrangement. In a single bit line arrangement, each row of the memory array 22 has two associated bit lines, one of which is used for the first port (port A) and the other of which is used for the second port (port B). The illustrative arrangement shown in FIG. 2 uses a differential bit line arrangement. In a differential bit line arrangement, each row of the memory array has four associated bit lines. One differential pair of bit lines in each row is associated with the first port and the other differential pair of bit lines in each row is associated with the second port. As shown in FIG. 2, the pair of bit lines labeled BITA and BITNA in each row are associated with the first port (port A), whereas the pair of bit lines labeled BITB and BITNB in each row are associated with the second port.

Figure 3:
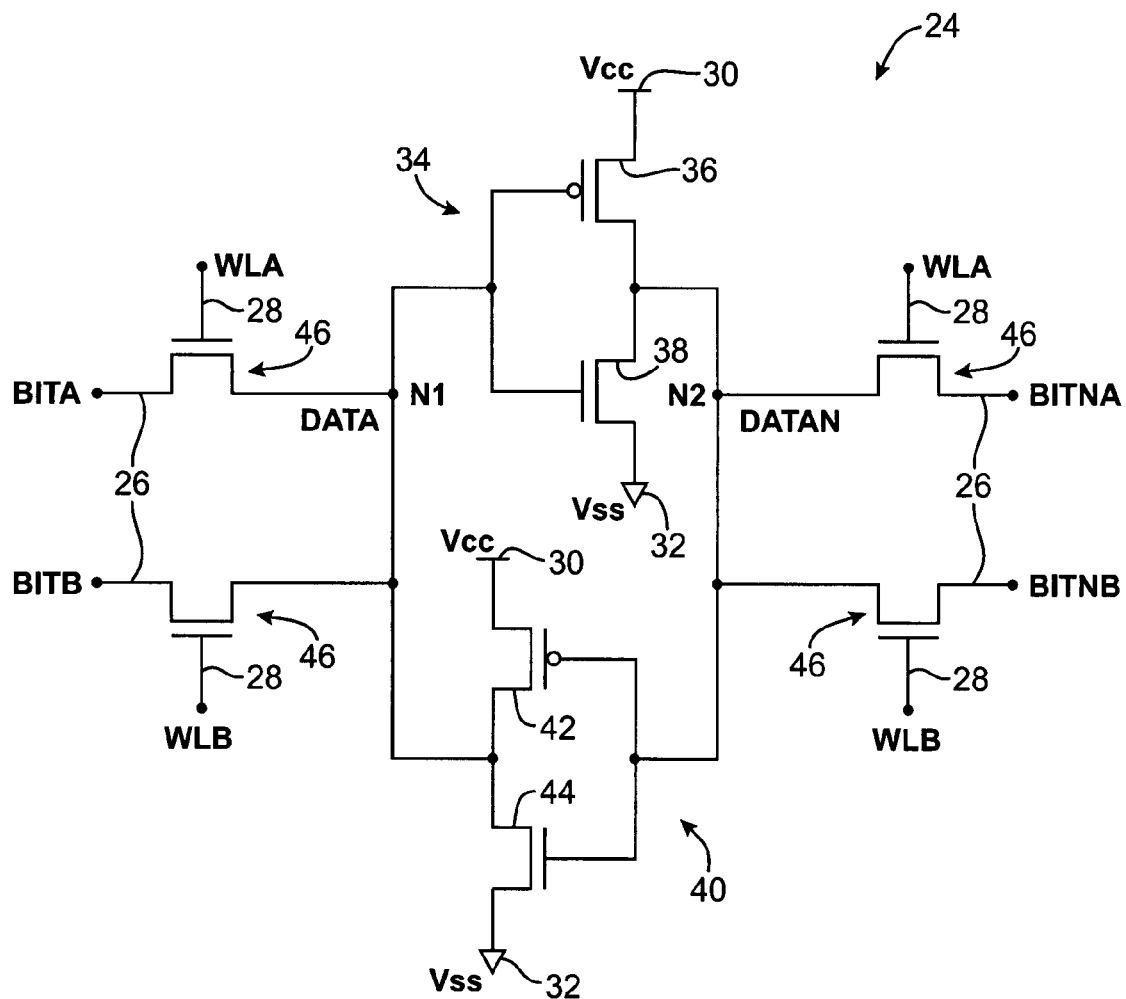
FIG. 3 is a diagram of an illustrative memory cell in a dual port memory array in accordance with an embodiment of the present invention.

An illustrative memory cell 24 is shown in FIG. 3. Memory cell 24 has two cross-coupled inverters 34 and 40. Inverter 34 has p-channel metal-oxide-semiconductor (PMOS) transistor 36 and n-channel metal-oxide-semiconductor (NMOS) transistor 38. Inverter 40 has PMOS transistor 42 and NMOS transistor 44. The inverters 34 and 40 are powered with a positive power supply voltage Vcc supplied to terminals 30 (power supply source 30) and a ground power supply voltage Vss supplied to terminals 32. In a typical integrated circuit, Vcc may be 1.1 volts and Vss may be 0 volts. In general, any suitable values of Vcc and Vss may be used.

Memory cell 24 has four associated bit lines 26. During read operations through port A, data is read out of memory cell 24 over bit lines BITA and BITNA and is sensed using associated differential sense amplifier circuitry. During write operations through port A, data on bit lines BITA and BITNA is loaded into memory cell 24. Similarly, data is read out of memory cell 24 over bit lines BITB and BITNB during read operations through port B. During write operations through port B, data on bit lines BITB and BITNB is loaded into memory cell 24.

Memory cell 24 has four address transistors 46. One pair of address transistors 46 is controlled by the word line for port A (WLA) and is associated with port A. The other pair of address transistors 46 is controlled by the word line for port B (WLB) and is associated with port B. When WLA is asserted, the gates of the port A address transistors go high and the port A address transistors are turned on. With the port A transistors turned on, the bit lines BITA and BITNA are connected to nodes N1 and N2, respectively. When WLB is asserted, the gates of the port B address transistors go high and the port B address transistors are turned on. With the port B address transistors turned on, the bit lines BITB and BITNB are connected to nodes N1 and N2, respectively.

As shown in FIG. 3, the signal on node N1 is labeled "DATA" and represents the contents of memory cell 24, whereas the signal on node N2 is labeled "DATAN" and represents the inverse of the signal DATA. When a logic one is stored in cell 24, node N1 is high (e.g., Vcc) and node N2 is low (e.g., Vss). When a logic zero is stored in cell 24, node N1 is low (e.g., Vss) and node N2 is high (e.g., Vcc).

During a read operation, the two address transistors associated with a given port are turned on, so that the contents of the cell may be sensed over a differential bit line pair 26. For example, during a read operation on port A, word line signal WLA is asserted, which turns on the port A address transistors, so that signals DATA and DATAN are conveyed to a differential sense amplifier over bit lines BITA and BITNA, respectively.

During a write operation, the two address transistors associated with a given port are also turned on using a word line. For example, during a write operation on port B, word line signal WLB is asserted, which turns on the port B address transistors. The data that is to be loaded into cell 24 is provided by a bit line driver over differential bit lines BITB and BITNB. When the bit lines BITB and BITNB are connected to nodes N1 and N2 by turning on the port B address transistors, the data on lines BITB and BITNB is driven into the memory cell 24. For example, if a logic one is being loaded into cell 24, node N1 will be driven high (e.g., Vcc) by a high signal on bit line BITB while node N2 is being driven low (e.g., Vss) by a low signal on complementary bit line BITNB.

Dual port memory of the type described in connection with FIGS. 2 and 3 may be used to form a multichannel numerically controlled oscillator. One port of the dual port memory (e.g., port A) may be associated with a first output channel, while another port of the dual port memory (e.g., port B) may be associated with a second output channel. For a given memory bandwidth, a multichannel numerically controlled oscillator that is formed in this way may produce multiple channels of output while consuming fewer memory resources than conventional multichannel numerically controlled oscillators.

Figure 4:
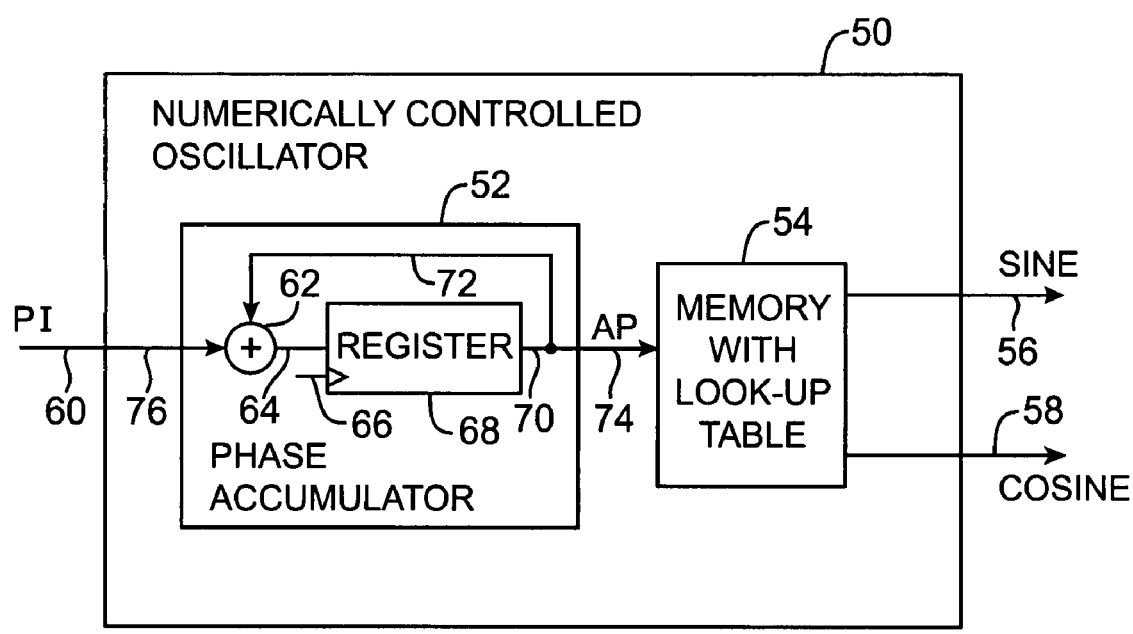
FIG. 4 is a schematic diagram of a conventional single-channel numerically controlled oscillator.

A conventional signal-channel numerically controlled oscillator is shown in FIG. 4. As shown in FIG. 4, numerically controlled oscillator 50 has a phase accumulator 52 and a memory 54. Memory 54 is addressed using a single port associated with path 74. Phase accumulator 52 produces an output signal AP. The signal AP represents a phase variable (sometimes called the "angular precision") that is used to address memory 54. The signal AP is a binary signal that is provided to memory 54 on multiple lines in path 74.

A look-up table is stored in memory 54. The look-up table contains a digital representation of the output functions for the numerically controlled oscillator for each possible value of AP. In the arrangement of FIG. 4, numerically controlled oscillator 50 is being used to produce a sine function output on output 56 and a cosine output function on output 58. Accordingly, the look-up table that is stored in memory 54 contains two columns of entries, one corresponding to a sine function and one corresponding to a cosine function. Each row in the look-up table corresponds to a different possible value of AP. The first column of the look-up table contains entries corresponding to the values of sine(AP). The second column of the look-up table contains entries corresponding to the values of cosine(AP).

During operation, the phase accumulator 52 produces an output AP that is continuously incremented. When the size of the look-up table (i.e., the maximum number of rows in the look-up table) is exceeded, the value of AP loops back to its lowest value. For example, if there are 4096 rows in the look-up table, the phase accumulator will produce a value of AP that continuously increments until exceeding 4096, at which point the value of AP will be reset (e.g., to one). With this type of arrangement, the value of AP continuously loops through the address space of the look-up table. The speed at which the value of AP loops through the look-up table index values is controlled by a phase incrementer setting for phase accumulator 52.

The two output signals (sine and cosine) from numerically controlled oscillator 50 are produced at the same frequency and represent a single output channel. The frequency of the output is determined by the value of the phase increment PI 60 that is applied to the input of phase accumulator 52. When the value of PI is one, the value of AP increments at its lowest possible rate and the output signals have a frequency f. When larger values of PI are used, the rate at which AP increments and the frequency of the output signals increases proportionally. For example, when the value of PI is increased from one to two, the signal AP steps through its values in steps that are twice as large as they would be if PI were equal to one. This doubles the frequency of the output signal to 2f. By providing additional bits of resolution in the phase accumulator, additional frequency ratios may be obtained. For example, use of a 13-bit phase accumulator in a numerically controlled oscillator having a 12-bit memory allows the numerically controlled oscillator to produce an output signal that has a frequency of 1.5f.

The phase accumulator 52 has an input 76 that receives the value of phase incrementer PI 60 and has an output 74 at which a corresponding value of signal AP is provided. Phase accumulator 52 has a register 68 and an adder 62. A clock signal is applied to clock input 66 of register 68. The output 70 of register 68 is connected to feedback path 72.

During operation, the output signal on output 70 of phase accumulator 52 is fed back to adder 62 via feedback line 72.

Adder 62, which receives the value of PI 60 from input 76, adds the value of PI 60 to the current output signal that is being fed back to adder 62 on path 72 and produces a corresponding result on path 64. This increments the value of the output signal being fed back on path 72. On the next clock pulse, this newly incremented value is clocked to the output line 70 through register 68. If the value of PI 60 is one, each clock pulse results in a value of AP on path 74 that is one larger than its previous value (i.e., AP=1, 2, 3, 4 . . . ) and results in an output frequency f for output functions sine and cosine. If PI is two, each clock pulse that is applied to the phase accumulator results in a value of AP that is two larger than its previous value (i.e., AP=1, 3, 5, 7, . . . ) and results in an output frequency of 2f for output functions sine and cosine. If PI is three, AP is incremented in steps of 3 (i.e., AP=1, 4, 7, 10, . . . ), so that the output frequency of the sine and cosine functions is 3f. With other values of PI, the output frequency scales proportionally.

The conventional numerically controlled oscillator arrangement of FIG. 1 is generally acceptable for designs that require only a single output channel. Designs that require more output channels may be implemented using more numerically controlled oscillators. For example, if two output channels are needed, two identical numerically controlled oscillators such as numerically controlled oscillator 50 of FIG. 4 may be included on an integrated circuit.

This type of duplication is wasteful of circuit resources. Particularly in environments such as programmable logic device integrated circuit environments in which resources such as the memory used to implement oscillator look-up tables are scare, the use of multiple separate numerically controlled oscillators to produce multiple channels of oscillator output can be unacceptably inefficient.

Figure 5:
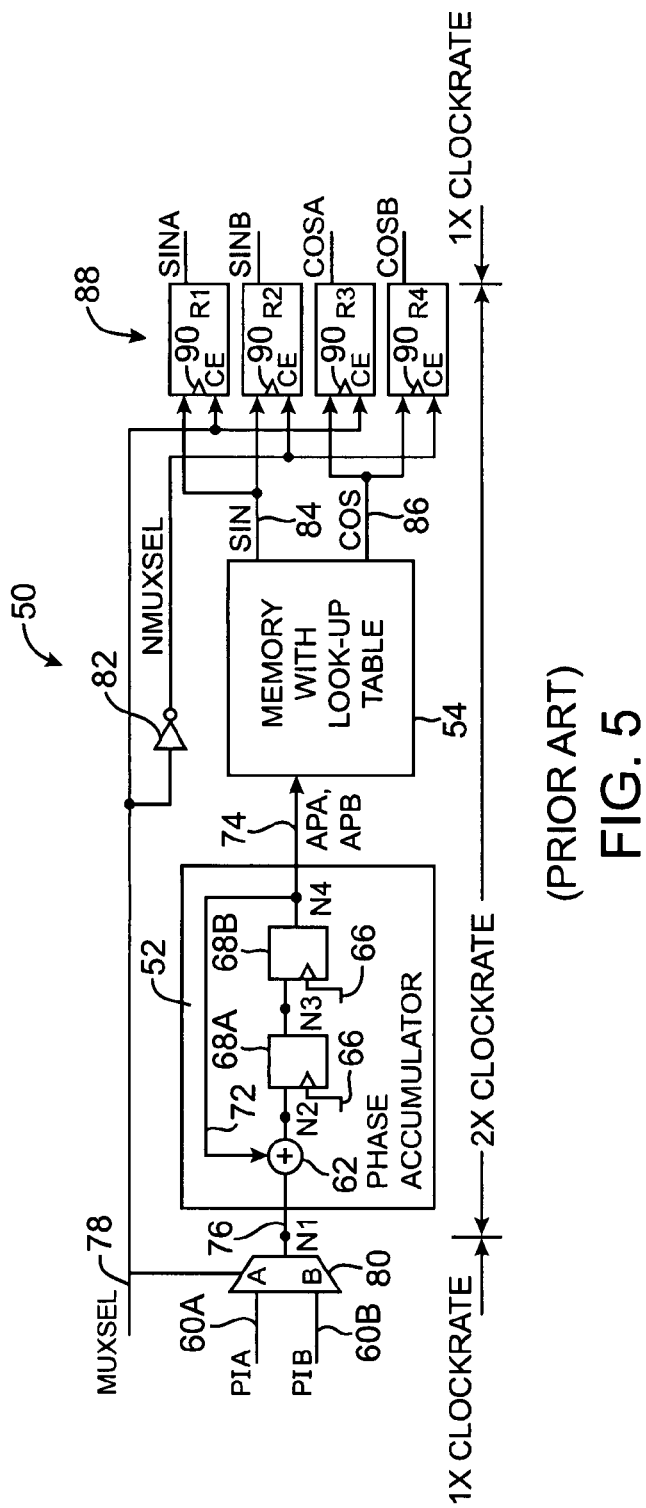
FIG. 5 is a schematic diagram of a conventional two-channel numerically controlled oscillator that has been implemented using a phase accumulator and memory with a doubled clock rate.
Figure 6:
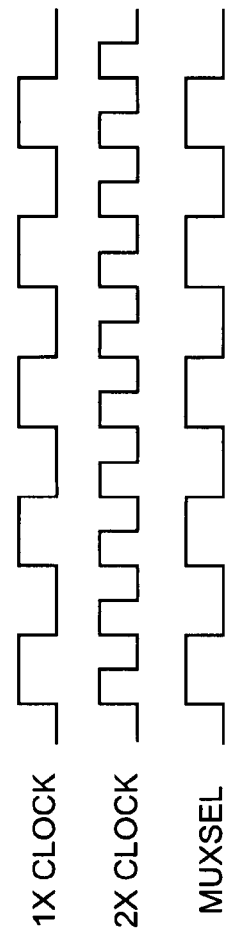
FIG. 6 shows illustrative clock and control signals that may be used to control a numerically controlled oscillator that uses a doubled clock rate.

One way to reduce the amount of memory resources that are used to implement the numerically controlled oscillator is to time share the memory 54 between multiple channels. This type of arrangement is shown in FIG. 5. With the arrangement of FIG. 5, two independent channels of output are produced. This is possible because components such as phase accumulator 52 and memory 54 are clocked using a double rate (2×) clock. A multiplexer control signal MUXSEL operates at a 1× clock rate, as shown in FIG. 6. As shown in FIG. 5, two phase incrementer signals PIA and PIB are applied to respective inputs 60A and 60B of numerically controlled oscillator 50 at the 1× clock rate. When MUXSEL is high, multiplexer 80 connects input 60A to its output 76. When MUXSEL is low, multiplexer 80 connects input 60B to its output 76.

Due to the time-division multiplexing operation of multiplexer 80, the two signals PIA and PIB alternate on node N1. Phase accumulator 52 has an adder 62 that adds the value of the signal on node N1 (i.e., PIA or PIB) to the value of the signal on node N4 that is being fed back to adder 62 via feedback path 72. Registers 68A and 68B are used to clock signals from the output of adder 62 (node N2) to nodes N3 and N4. The 2× clock is applied to clock inputs 66 of registers 68A and 68B, so the output of adder 62 is processed at the 2× clock rate.

The operation of a double-rate phase accumulator of the type shown in FIG. 5 may be understood with reference to the table of FIG. 7. The rows of the table of FIG. 7 correspond to unique incrementing time periods (i.e., rising clock edges in the 2× clock). Each column in the table of FIG. 7 shows the value of the signal at a respective node in the numerically controlled oscillator. Entries that are labeled with the symbol "A" correspond to signals that are associated with the first ("A") channel of the numerically controlled oscillator. Entries that are labeled with the symbol "B" correspond to signals that are associated with the second ("B") channel of the numerically controlled oscillator.

At time t1, MUXSEL is high and signal PIA from input 60A is routed to node N1 by multiplexer 80. Adder 62 adds the signal on node N4 to the signal on node N2. In this example, the signals on nodes N3 and N4 are not defined at time t1, so the entries in the last two columns of the first row of the table are each marked with an "X." As indicated by the entry "A" in the node N2 column in the row corresponding to time t1, the output of adder 62 and the signal value on node N2 are associated with the first channel.

At time t2, MUXSEL goes low. This directs multiplexer 80 to route signal PIB from input 60B to node N1. Adder 62 produces an output on node N2 that is associated with channel B by adding the signal PIB to the undefined signal from node N4.

By time t3, all nodes of the circuit have defined values. The progression of the clock from time t2 to t3 causes registers 68A and 68B to clock their inputs to their outputs. Accordingly, the input N2 to register 68A at time t2 is provided on node N3 (the output of register 68A) at time t3. Similarly, the signal on node N3 at time t2 is passed to the output of register 68B (node N4) at time t3.

At time t3, MUXSEL is high, so node N1 is receiving the signal PIA for channel A from multiplexer 80. Adder 62 receives the current output signal for channel A (called APA) from node N4 via feedback path 72. At the same time, adder 62 receives the signal PIA from node N1. As shown in FIG. 7, both of these inputs are associated with channel A, so the resulting added output signal that adder 62 produces on its output (node N2) is also associated with channel A. This is indicated by the "A" entry in the N2 column of the table at time t3.

As time progresses, the signals for the A and B channels become interleaved as they pass through the phase accumulator. Output signals on node N4 that are associated with channel A are always fed back to the adder 62 at the same time that adder 62 is receiving an input signal PIA for channel A. Similarly, whenever adder 62 is receiving a signal PIB that is associated with channel B, the value of the signal on output node N4 (and therefore feedback path 72) is associated with channel B. As a result, two sets of output signals are produced by phase accumulator 52. Output signal APA is associated with the first channel (channel A), whereas output signal APB is associated with the second channel (channel B). Phase accumulator 52 continuously increments the APA signal by phase increment PIA on input 60A and independently increments the APB signal by phase increment PIB on input 60B. The values of PIA and PIB are not generally equal. During operation, the signals APA and APB alternate on path 74 at the 2× clock rate (i.e., the signal on path 74 is APA, APB, APA, APB, . . . ).

The signals APA and APB on path 74 are used to address the look up table in memory 54 at the 2× clock rate. In response, memory 54 produces a sine function output at the 2× clock rate on output 84. Memory 54 also produces a cosine function output at the 2× clock rate on output 86.

Registers 88 receive the sine and cosine signals from paths 84 and 86 at their data inputs. Registers 88 form two time-division demultiplexing multiplexers. Signals sine and cosine on paths 84 and 86 are presented to the inputs of these multiplexers at the 2× clock rate. Registers 88 demultiplex these signals to produce two channels of output each of which has a 1× clock rate. In particular, half of the sine signals on output 84 are routed to the sin A output of register R1, while the other half of the sine signals on output 84 are routed to the sin B output of register R2. Similarly, half of the cosine signals on output 86 are routed to the cos A output of register R3, while the other half of the cosine signals on output 86 are routed to the cos B output of register R4. The sin A and cos A signals collectively form output functions for channel A, whereas the sin B and cos B signals collectively form output functions for channel B.

The demultiplexing operations of registers 88 are performed using the multiplexer control signal MUXSEL. Signal MUXSEL is received by numerically controlled oscillator 50 on input 78. As shown in FIG. 6, signal MUXSEL toggles at a 1× clock rate. Inverter 82 inverts the MUXSEL signal to produce inverted multiplexer control signal NMUXSEL. Registers 88 each have a clock input 90 that is clocked at the 2× clock rate. Registers 88 also each have a clock enable input CE. The signal MUXSEL is applied to the clock enables CE of registers R1 and R3. The signal NMUXSEL is applied to the clock enables CE of registers R2 and R4.

When MUXSEL is high, NMUXSEL is low. In this situation, the clock enables CE of registers R1 and R3 are high and the clock enables CE of registers R2 and R4 are low. This enables registers R1 and R3 and disables registers R2 and R4. Registers R1 and R3 therefore clock their inputs to their outputs on the next rising edge of the 2× clock, while registers R2 and R4 remain inactive. The input to register R1 is the channel A sine signal on path 84. This channel A sine signal is produced on path 84 as a result of applying the address signal APA to the look-up table of memory 54 via path 74. Because the channel A sine signal is applied to its input while its CE is high, register R1 produces the function sin A on its output on the rising edge of its 2× clock. The input to register R3 is the channel A cosine signal on path 86. The channel A cosine signal is produced by applying the APA address signal to the look-up table of memory 54. With its CE signal high, register R3 produces the function cos A on its output on its next rising clock edge. The registers R1 and R3 therefore produce the sine and cosine signals for channel A.

When MUXSEL is low, NMUXSEL is high. This makes the clock enables CE of registers R2 and R4 high while holding the clock enables CE of registers R1 and R3 low. The low clock enable signals on registers R1 and R3 prevent registers R1 and R3 from clocking their inputs to their outputs on the next rising clock edge of the 2× clock. The high clock enable signals on registers R2 and R4 enable registers R2 and R4 to clock their inputs to their outputs on the next rising edge of the 2× clock. The signal APB has replaced the signal APA on path 74 at this time, so the sine and cosine outputs on paths 84 and 86 correspond to the channel B sine and cosine functions. The input to register R2 is therefore the channel B sine signal on path 84, whereas the input to register R4 is the channel B cosine signal on path 86. In this situation, register R2 produces the function sin B on its output, whereas register R4 produces the function cos B on its output. The registers R2 and R4 therefore produce the sine and cosine signals for channel B.

As MUXSEL toggles between its high and low states, this pattern continues. The outputs of registers 88 produce interleaved channel A and channel B output. Channel A output is provided as functions sin A and cos A at the outputs of registers R1 and R3. On the next rising 2× clock edge, channel B output is provided as functions sin B and cos B at the outputs of registers R2 and R4. Each channel produces its outputs in response to the MUXSEL signal (either directly or through its inverted version NMUXSEL). Because the MUXSEL signal toggles at the 1× clock rate, the signals of each channel are produced at the 1× clock rate (i.e., the channel A signals sin A and cos A are produced at a 1× clock rate and the channel B signals sin B and cos B are produced at the 1× clock rate).

By sharing memory 54 between two channels, the conventional two-channel numerically controlled oscillator of FIG. 5 uses fewer memory resources than an arrangement made up of two single-channel numerically controlled oscillators of the type shown in FIG. 4. Although memory resources are conserved, there is an increased requirement for the clock rate of the memory and phase accumulator circuitry. This is because the phase accumulator and memory are being time multiplexed. Half of the time phase accumulator 52 and memory 54 are being used to handle channel A signals and half of the time phase accumulator and memory 54 are being used to handle channel B signals. The multiplexer 80 time multiplexes the channel A and channel B phase incrementers at the input to the numerically controlled oscillator, whereas the demultiplexers formed from registers 88 are used to time demultiplex the channel A and channel B oscillator outputs of the numerically controlled oscillator.

As a result of this time multiplexing arrangement, memory 54 and phase accumulator 52 of FIG. 5 must be able to handle a clock rate that is twice the clock rate of the channel A and channel B output signal. If, for example, it is desired to produce two 200 MHz output signals (i.e., a 200 MHz channel A output and a 200 MHz channel B output), phase accumulator 52 and memory 54 must be able to handle a 400 MHz clock rate. In environments in which memory 54 is unable to handle the elevated clock rate of the 2× clock, it is not possible to use the conventional arrangement of FIG. 5.

Figure 8:
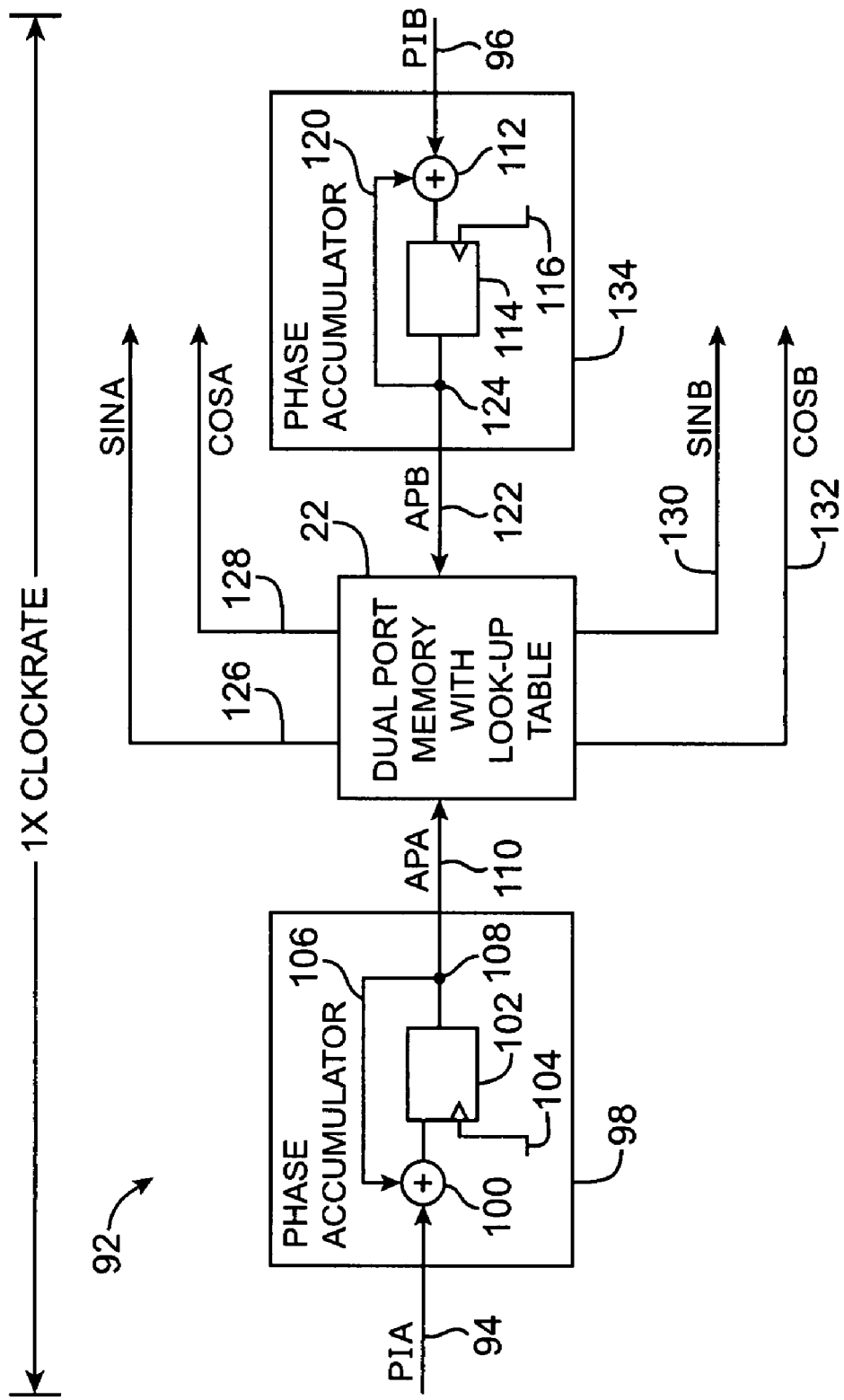
FIG. 8 is a schematic diagram of an illustrative numerically controlled oscillator in accordance with an embodiment of the present invention.

An illustrative multichannel numerically controlled oscillator in accordance with an embodiment of the present invention is shown in FIG. 8. Multichannel numerically controlled oscillator 92 has a dual port memory 22 that is shared between two phase accumulators. An output function generation look-up table is implemented in memory 22 to support memory-based function generation on output lines 126, 128, 130, and 132. In general, the look-up table of memory 22 may contain entries that define any suitable functions. In the example of FIG. 8, the look-up table contains two columns of entries. One column is used to produce sine function outputs on output paths 126 and 130 as a function of inputs APA and APB. The other column is used to produce cosine function outputs on output paths 128 and 132 as a function of inputs APA and APB. If desired, the look-up table that is implemented in memory 22 may contain a single column of entries (i.e., when only a single output function is required per output channel) or may contain three or more columns of entries (i.e., when three or more output functions are required per output channel). The arrangement of FIG. 8 in which each channel has an associated sine function and cosine function output is shown as an example. In the example of FIG. 8, a first channel (channel A) produces output functions sin A and cos A on outputs 126 and 128 in response to a memory address signal APA, whereas a second channel (channel B) produces output functions sin B and cos B on outputs 130 and 132 in response to a memory address signal APB.

Any suitable type of dual port memory may be used for memory 22. For example, memory 22 may be formed using a dual port memory such as a dual port memory of the type described in connection with FIGS. 1-3. If desired, memory 22 may be formed by combining multiple blocks of dual-port memory. For example, configuration data may be loaded into programmable memory elements 20 on a programmable logic device integrated circuit 10 to assemble the dual port memory in numerically controlled oscillator 92 from multiple blocks of dual port memory. The dual port memory may support a look-up table of any desired size (e.g., a 12 bit look-up table).

The two ports of dual port memory 22 may be used to perform simultaneous look up operations for the two channels of numerically controlled oscillator. A first port of dual port memory 22 (port A) may be used in addressing memory 22 using the signal APA that is produced on path 110 by phase accumulator 98, while a second port (port B) may be used in simultaneously addressing memory 22 using the signal APB that is produced on path 122 by phase accumulator 134.

During operation, phase accumulator 98 receives phase incrementer PIA for channel A on input 94 and provides memory 22 with a corresponding memory address APA on path 110. Phase accumulator 134 receives phase incrementer PIB for channel B on input 96 and provides memory 22 with a corresponding memory address APB on path 122.

As shown in FIG. 8, each phase accumulator preferably has a register, an adder, and a feedback path. Phase accumulator 98 has an adder 100 that adds the phase incrementer PIA on path 94 to the value of register output signal APA that is fed back to adder 100 from node 108 via feedback path 106. Phase accumulator 134 has an adder 112 that adds the phase incrementer PIB on path 96 to the value of register output signal APB that is fed back to adder 112 from node 124 via feedback path 120. The values of PIA and PIB may be adjusted independently. When the value of PIA is increased, the memory address APA steps through the rows of the look-up table in memory 22 more rapidly, thereby increasing the frequency of the sine and cosine output functions associated with channel A. When the value of PIB is increased, phase accumulator 134 increments the signal APB at an increased rate, thereby increasing the frequency of the sine and cosine output functions associated with channel B. Because PIA and PIB can be adjusted independently, the frequencies of the channel A outputs can be adjusted separately from the frequencies of the channel B outputs.

Unlike the conventional dual channel numerically controlled oscillator 50 of FIG. 5, which uses a double rate (2×) clock for its phase accumulator and memory to produce a two-channel output, dual channel numerically controlled oscillator 92 of FIG. 8 uses a single rate clock (i.e., a 1× clock) to handle the signals for phase accumulators 98 and 134 and memory 22. For example, registers 104 and 114, which are used to clock the outputs of adders 100 and 112 through phase accumulators 98 and 134 respectively, are clocked using a 1× clock provided to clock inputs 104 and 116. Memory 22 is also clocked using a 1× clock signal.

Because memory 22 is a dual port memory, the look-up table in memory 22 can be simultaneously addressed during read operations using two phase accumulators (phase accumulators 98 and 134). This allows memory 22 of numerically controlled oscillator 92 to be shared between two phase accumulators without resorting to time multiplexing schemes of the type described in connection with FIG. 5. As a result, the clock rate requirements for phase accumulators 98 and 134 and memory 22 are significantly reduced. For example, if it is necessary to provide two channels of output (i.e., channels A and B) at a clock rate of 200 MHz, the clock rate for phase accumulators 98 and 134 will be 200 MHz. With conventional two-channel numerically controlled oscillators having a time-shared memory architecture of the type shown in FIG. 5, the clock rate for the phase accumulator and memory circuitry is doubled, forcing the use of a 400 MHz clock to produce two channels of 200 MHz output. With the dual port memory arrangement of FIG. 8, in contrast, there is no clock rate doubling, which relieves the clock rate burden on memory 22.

The example of FIG. 8 shows how two phase accumulators may be used with a dual port memory to produce two channels of output functions (each with a sine and cosine output). If desired, the number of channels of output that the numerically controlled oscillator 92 of FIG. 8 supports may be increased using time multiplexing schemes of the type described in connection with FIG. 5. For example, two phase incrementer signals may be applied to input 94 using a time-division multiplexing multiplexer such as multiplexer 80 of FIG. 5. An identical multiplexer may be used to provide two phase incrementers to input 96. At the same time, outputs 126, 128, 130, and 132 can be connected to four registers such as registers R1, R2, R3, and R4 of FIG. 5. The multiplexers and registers may then be controlled by MUXSEL and NMUXSEL signals and the clock rate for phase accumulators 98 and 134 and memory 22 can be doubled. With this type of arrangement, numerically controlled oscillator can produce four channels of output using a 2× clock, whereas the conventional arrangement of FIG. 5 would only be able to produce two channels of output using a 2× clock. If desired, additional time division multiplexing circuitry may be used (e.g., to produce eight channels of output using a 4× clock, to produce sixteen channels of output using a 8× clock, etc.). The two channel multichannel architecture of FIG. 8 is merely illustrative.

The foregoing is merely illustrative of the principles of this invention and various modifications can be made by those skilled in the art without departing from the scope and spirit of the invention.

What is claimed is:

1. A multichannel numerically controlled oscillator comprising:
   a dual port memory having an output function generation look-up table that is addressed using a first port to produce a first channel of output and that is addressed using a second port to produce a second channel of output;
   a first phase accumulator that receives a first phase incrementer signal and that provides a first continuously incremented output signal to the first port of the dual port memory to address the look-up table; and
   a second phase accumulator that receives a second phase incrementer signal and that provides a second continuously incremented output signal to the second port of the dual port memory to address the look-up table, wherein the first continuously incremented output signal and the second continuously incremented output signal are provided to the dual port memory simultaneously.

2. The multichannel numerically controlled oscillator defined in claim 1 wherein the first phase accumulator comprises an adder having a first input and a second input and having an output, a register having an input connected to the output of the adder and having an output connected to the first port of the dual port memory, and a feedback path that is connected between the first port of the dual port memory and the second input of the adder.

3. The multichannel numerically controlled oscillator defined in claim 1 wherein the first phase accumulator comprises an adder having a first input and a second input and having an output, a register having an input connected to the output of the adder and having an output connected to the first port of the dual port memory, and a feedback path that is connected between the first port of the dual port memory and the second input of the adder and wherein the first phase incrementer signal is received by the first input.

4. The multichannel numerically controlled oscillator defined in claim 1 wherein the first phase accumulator comprises a first adder having a first input and a second input and having an output, a first register having an input connected to the output of the first adder and having an output connected to the first port of the dual port memory, and a first feedback path that is connected between the first port of the dual port memory and the second input of the first adder, wherein the first phase incrementer signal is received by the first input of the first adder, wherein the second phase accumulator comprises a second adder having a first input and a second input and having an output, a second register having an input connected to the output of the second adder and having an output connected to the second port of the dual port memory, and a second feedback path that is connected between the second port of the dual port memory and the second input of the second adder, and wherein the second phase incrementer signal is received by the first input of the second adder.

5. The multichannel numerically controlled oscillator defined in claim 1 wherein the first channel of output comprises a sine function output signal, the multichannel numerically controlled oscillator further comprising:
 a sine function output path connected to the dual port memory on which the sine function output is provided.

6. A multichannel numerically controlled oscillator comprising:
 a dual port memory having an output function generation look-up table that is addressed using a first port to produce a first channel of output and that is addressed using a second port to produce a second channel of output;
 a first phase accumulator that receives a first phase incrementer signal and that provides a corresponding continuously incremented output signal to the first port of the dual port memory to address the look-up table;
 a second phase accumulator that receives a second phase incrementer signal and that provides a corresponding continuously incremented output signal to the second port of the dual port memory to address the look-up table, wherein the first channel of output comprises a sine function output signal and a cosine function output signal;
 a sine function output path connected to the dual port memory on which the sine function output for the first channel is provided; and
 a cosine function output path connected to the dual port memory on which the cosine function output for the first channel is provided.

7. The multichannel numerically controlled oscillator defined in claim 6, wherein the second channel of output comprises a sine function output signal and a cosine function output signal, and wherein the multichannel numerically controlled oscillator further comprises:
 a second sine function output path connected to the dual port memory on which the sine function output for the second channel is provided; and
 a second cosine function output path connected to the dual port memory on which the cosine function output for the second channel is provided.

8. Multichannel numerically controlled oscillator circuitry comprising:
 a dual port memory having an output function generation look-up table that is addressed using a first port to produce a first channel of output and that is addressed using a second port to produce a second channel of output, wherein the dual port memory comprises a plurality of dual port memory cells, each dual port memory cell having cross-coupled inverters and first and second ports for performing read operations on the dual port memory cell, wherein the first port of each of the dual port memory cells is formed using a first pair of address transistors, a first pair of bit lines, and a first word line that controls the first pair of address transistors, and wherein the second port of each of the dual port memory cells is formed using a second pair of address transistors, a second pair of bit lines, and a second word line that controls the second pair of address transistors;
 a first phase accumulator that receives a first phase incrementer signal and that provides a corresponding continuously incremented output signal to the first port of the dual port memory to address the look-up table; and
 a second phase accumulator that receives a second phase incrementer signal and that provides a corresponding continuously incremented output signal to the second port of the dual port memory to address the look-up table.

9. The multichannel numerically controlled oscillator circuitry defined in claim 8 wherein the first phase accumulator comprises a first adder having a first input and a second input and having an output, a first register having an input connected to the output of the first adder and having an output connected to the first port of the dual port memory, and a first feedback path that is connected between the first port of the dual port memory and the second input of the first adder, wherein the first phase incrementer signal is received by the first input of the first adder, wherein the second phase accumulator comprises a second adder having a first input and a second input and having an output, a second register having an input connected to the output of the second adder and having an output connected to the second port of the dual port memory, and a second feedback path that is connected between the second port of the dual port memory and the second input of the second adder, and wherein the second phase incrementer signal is received by the first input of the second adder.

10. The multichannel numerically controlled oscillator circuitry defined in claim 8 wherein the first channel of output comprises a sine function output signal and a cosine function output signal, the multichannel numerically controlled oscillator further comprising:
 a sine function output path connected to the dual port memory on which the sine function output for the first channel is provided; and
 a cosine function output path connected to the dual port memory on which the cosine function output for the first channel is provided.

11. The multichannel numerically controlled oscillator circuitry defined in claim 8, wherein the first channel of output comprises a sine function output signal and a cosine function output signal, wherein the second channel of output comprises a sine function output signal and a cosine function output signal, and wherein the multichannel numerically controlled oscillator further comprises:
 a first sine function output path connected to the dual port memory on which the sine function output for the first channel is provided;
 a first cosine function output path connected to the dual port memory on which the cosine function output for the first channel is provided;
 a second sine function output path connected to the dual port memory on which the sine function output for the second channel is provided; and
 a second cosine function output path connected to the dual port memory on which the cosine function output for the second channel is provided.

12. A programmable logic device integrated circuit comprising:
a plurality of programmable logic regions containing programmable elements that are programmed using configuration data; and
a numerically controlled oscillator having:
a dual-port memory array having first and second ports and having an output function generation look-up table that is addressed using the first port to produce a first channel of output and that is addressed using the second port to produce a second channel of output;
a first phase accumulator that receives a first phase incrementer signal and that provides a first continuously incremented output signal to the first port of the dual port memory array to address the look-up table; and
a second phase accumulator that receives a second phase incrementer signal and that provides a second continuously incremented output signal to the second port of the dual port memory array to address the look-up table, wherein the first continuously incremented output signal and the second continuously incremented output signal are provided to the dual port memory array simultaneously.

13. The programmable logic device integrated circuit defined in claim 12 wherein the first and second phase accumulators comprise first and second respective adders.

14. The programmable logic device integrated circuit defined in claim 12 wherein the first phase accumulator and the second phase accumulator each have a single register.

15. The programmable logic device integrated circuit defined in claim 12 wherein the dual port memory array comprises multiple blocks of dual port memory, wherein the first and second phase accumulators comprise first and second respective adders, and wherein the first phase accumulator and the second phase accumulator each have a single register.

16. The programmable logic device integrated circuit defined in claim 12 wherein the first phase accumulator comprises a first adder having a first input and a second input and having an output, a first register having an input connected to the output of the first adder and having an output connected to the first port of the dual port memory array, and a first feedback path that is connected between the first port of the dual port memory array and the second input of the first adder, wherein the first phase incrementer signal is received by the first input of the first adder, wherein the second phase accumulator comprises a second adder having a first input and a second input and having an output, a second register having an input connected to the output of the second adder and having an output connected to the second port of the dual port memory array, and a second feedback path that is connected between the second port of the dual port memory array and the second input of the second adder, wherein the second phase incrementer signal is received by the first input of the second adder.

17. The programmable logic device integrated circuit defined in claim 12 wherein the first channel of output has an associated clock rate and wherein the first accumulator comprises a register having a clock input, wherein the clock input of the register receives a clock having a clock rate equal to the clock rate of the first channel of output.

18. The programmable logic device integrated circuit defined in claim 12 wherein the first channel of output has an associated clock rate, wherein the first accumulator comprises a first register having a first clock input, wherein the first clock input of the first register receives a clock having a clock rate equal to the clock rate of the first channel of output, wherein the second channel of output has an associated clock rate that is equal to the clock rate associated with the first channel of output, wherein the second accumulator comprises a second register having a second clock input, wherein the second clock input of the second register receives the clock having the clock rate equal to the clock rate of the first channel of output.

19. The programmable logic device integrated circuit defined in claim 12 wherein the first channel of output and the second channel of output have an associated clock rate, wherein the first phase accumulator comprises a first adder having a first input and a second input and having an output, a first register having an input connected to the output of the first adder, having a clock input that receives a clock, and having an output connected to the first port of the dual port memory array, and a first feedback path that is connected between the first port of the dual port memory array and the second input of the first adder, wherein the first phase incrementer signal is received by the first input of the first adder, wherein the second phase accumulator comprises a second adder having a first input and a second input and having an output, a second register having an input connected to the output of the second adder, having a clock input that receives the clock, and having an output connected to the second port of the dual port memory array, and a second feedback path that is connected between the second port of the dual port memory array and the second input of the second adder, wherein the second phase incrementer signal is received by the first input of the second adder, and wherein the clock has a clock rate equal to the clock rate associated with the first and second channels of output.

20. A programmable logic device integrated circuit comprising:
a plurality of programmable logic regions containing programmable elements that are programmed using configuration data; and
a numerically controlled oscillator having:
a dual-port memory array having first and second ports and having an output function generation look-up table that is addressed using the first port to produce a first channel of output and that is addressed using the second port to produce a second channel of output;
a first phase accumulator that receives a first phase incrementer signal and that provides a corresponding continuously incremented output signal to the first port of the dual port memory array to address the look-up table;
a second phase accumulator that receives a second phase incrementer signal and that provides a corresponding continuously incremented output signal to the second port of the dual port memory array to address the look-up table, wherein the first channel of output and the second channel of output have an associated clock rate, wherein the first phase accumulator comprises a first adder having a first input and a second input and having an output, a first register having an input connected to the output of the first adder, having a clock input that receives a clock, and having an output connected to the first port of the dual port memory array, a first feedback path that is connected between the first port of the dual port memory array and the second input of the first adder, wherein the first phase incrementer signal is received by the first input of the first adder, wherein the second phase accumulator comprises a second adder having a first input and a second input and having an output, a second register having an input connected to the output of the second adder, having a clock input that receives the clock, and having an output connected to the second port of the dual port memory array, a second feedback path that is connected between the second port of the dual port memory array and the second input of the second adder, wherein the second phase incrementer signal is received by the first input of the second adder, wherein the clock has a clock rate equal to the clock rate associated with the first and second channels of output, wherein the first channel of output comprises a sine function output signal and a cosine function output signal, wherein the second channel of output comprises a sine function output signal and a cosine function output signal, and wherein the multichannel numerically controlled oscillator further comprises:

a first sine function output path connected to the dual port memory array on which the sine function output for the first channel is provided;

a first cosine function output path connected to the dual port memory array on which the cosine function output for the first channel is provided;

a second sine function output path connected to the dual port memory array on which the sine function output for the second channel is provided; and a second cosine function output path connected to the dual port memory array on which the cosine function output for the second channel is provided.

* * * * *